United States Patent
Ikeda et al.

(10) Patent No.: US 11,842,886 B2
(45) Date of Patent: Dec. 12, 2023

(54) PLASMA PROCESSING METHOD AND PLASMA PROCESSING APPARATUS

(71) Applicant: Tokyo Electron Limited, Tokyo (JP)

(72) Inventors: Taro Ikeda, Yamanashi (JP); Hirokazu Ueda, Yamanashi (JP); Eiki Kamata, Yamanashi (JP); Mitsutoshi Ashida, Yamanashi (JP); Isao Gunji, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 228 days.

(21) Appl. No.: 17/063,260

(22) Filed: Oct. 5, 2020

(65) Prior Publication Data

US 2021/0111003 A1 Apr. 15, 2021

(30) Foreign Application Priority Data

Oct. 11, 2019 (JP) ................ 2019-188105

(51) Int. Cl.
*H01J 37/32* (2006.01)
*B08B 7/00* (2006.01)

(52) U.S. Cl.
CPC ...... *H01J 37/32266* (2013.01); *B08B 7/0035* (2013.01); *H01J 37/3244* (2013.01); *H01J 2237/335* (2013.01)

(58) Field of Classification Search
CPC ............ H01J 37/32266; H01J 37/3244; H01J 2237/335; H01J 37/32311; B08B 7/0035
See application file for complete search history.

(56) References Cited

U.S. PATENT DOCUMENTS

| | | | |
|---|---|---|---|
| 2001/0006849 A1* | 7/2001 | Suzuki | H01J 37/32302 438/712 |
| 2007/0107750 A1* | 5/2007 | Sawin | C23C 16/4405 134/1.1 |
| 2015/0040822 A1* | 2/2015 | Olsen | C30B 29/08 117/97 |
| 2017/0040145 A1* | 2/2017 | Brandon | H01J 37/32293 |

FOREIGN PATENT DOCUMENTS

| | | |
|---|---|---|
| JP | 2013-206784 A | 10/2013 |
| JP | 6060016 B | 12/2016 |
| JP | 2017-157627 A | 9/2017 |
| KR | 10-2019-0001518 A | 1/2019 |

* cited by examiner

*Primary Examiner* — Erin F Bergner
(74) *Attorney, Agent, or Firm* — Venjuris, P.C.

(57) ABSTRACT

A plasma processing method includes: supplying a gas into a processing container; and intermittently supplying microwave powers output from a plurality of microwave introducing modules into the processing container. In the intermittently supplying the microwave powers, the supply of all the microwave powers from the plurality of microwave introducing modules is periodically in an OFF state for a given time.

5 Claims, 13 Drawing Sheets

PLASMA PROCESSING METHOD AND PLASMA PROCESSING APPARATUS

CROSS-REFERENCE TO RELATED APPLICATIONS

This application is based on and claims priority from Japanese Patent Application No. 2019-188105 filed on Oct. 11, 2019 with the Japan Patent Office, the disclosure of which is incorporated herein in its entirety by reference.

TECHNICAL FIELD

The present disclosure relates to a plasma processing method and a plasma processing apparatus.

BACKGROUND

Japanese Patent Laid-Open Publication No. 2017-157627 discloses a technology related to a plasma cleaning using a microwave. In the plasma cleaning, the cleaning processing is executed by the chemical action of radicals in the plasma and the physical action of ions.

Electromagnetic wave energy is concentrated in the vicinity of an electromagnetic wave radiation port, and the electron temperature of plasma tends to increase. The rise in the plasma electron temperature may cause damage due to impacts of the ions in the vicinity of the electromagnetic wave radiation port.

SUMMARY

According to an aspect of the present disclosure, a processing method performed by using a plasma in a processing container configured to process a substrate, including: supplying a gas into the processing container; and intermittently supplying microwave powers output from a plurality of microwave introducing modules into the processing container, is provided. In the intermittently supplying the microwave powers, the supply of all the microwave powers from the plurality of microwave introducing modules is periodically in an OFF-state for a given time.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
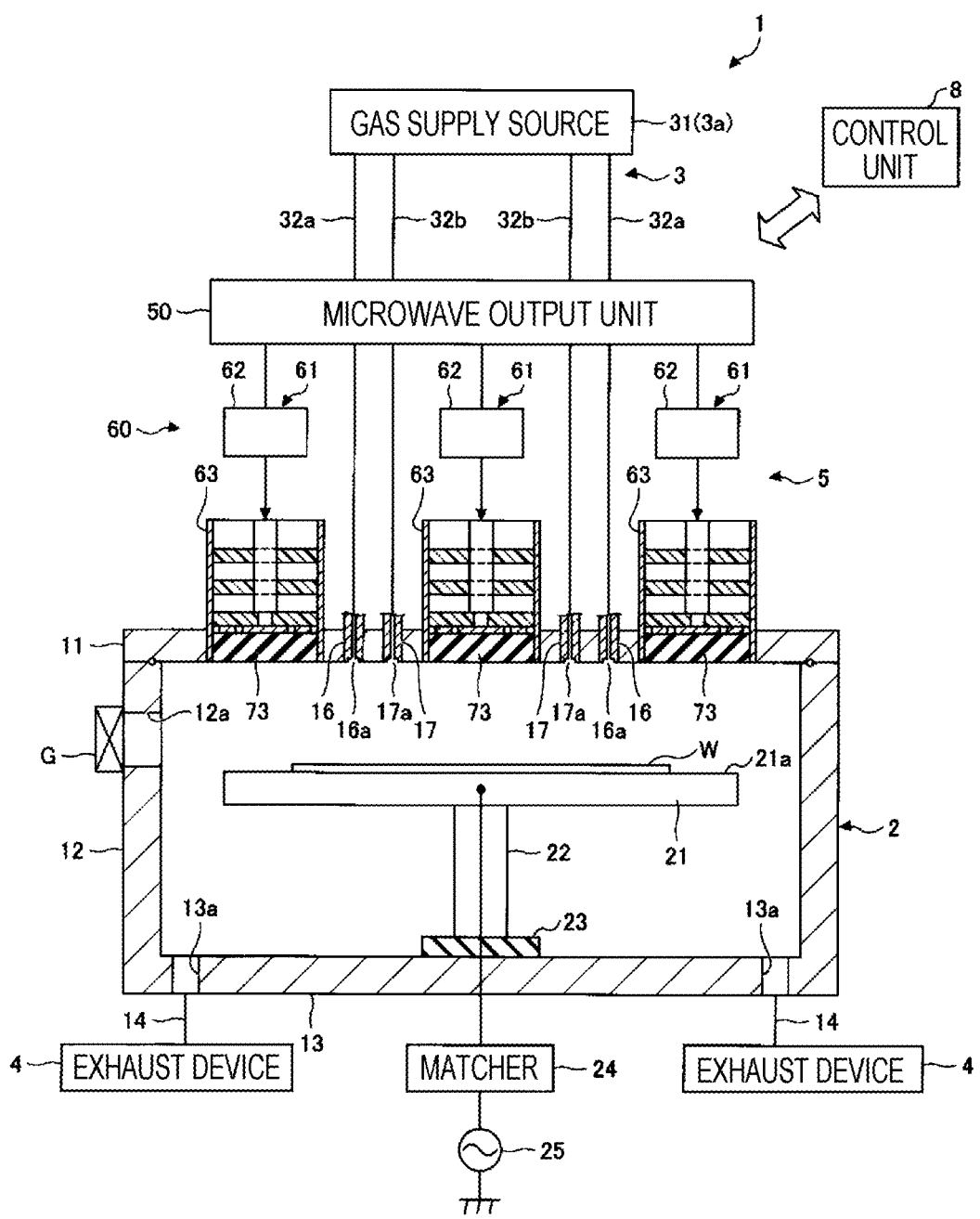
FIG. 1 is a schematic cross-sectional view illustrating an example of a plasma processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the drawings. In each drawing, the same components may be denoted by the same reference numerals, and duplicate description may be omitted.

[Plasma Processing Apparatus]

Figure 2:
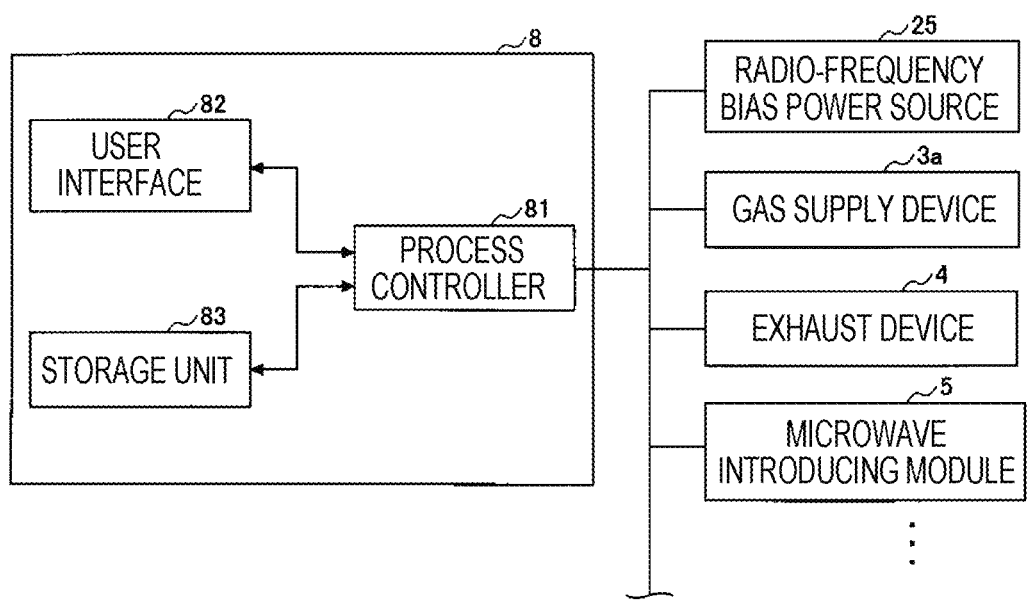
FIG. 2 is an explanation view illustrating a configuration of a control unit illustrated in FIG. 1.

First, a schematic configuration of a plasma processing apparatus 1 according to an embodiment will be described with reference to FIGS. 1 and 2. FIG. 1 is a schematic cross-sectional view illustrating an example of the plasma processing apparatus 1 according to the embodiment. FIG. 2 is an explanation view illustrating an example of a configuration of a control unit 8 illustrated in FIG. 1. The plasma processing apparatus 1 according to the embodiment is an apparatus configured to perform a predetermined processing such as a film forming processing, a diffusion processing, an etching processing, and an ashing processing on, for example, a substrate W having a semiconductor wafer for manufacturing a semiconductor device as an example, with a plurality of continuous operations.

The plasma processing apparatus 1 includes a processing container 2, a stage 21, a gas supply mechanism 3, an exhaust device 4, a microwave introducing module 5, and a control unit 8. The processing container 2 accommodates the substrate W that is a processing target, and the substrate W is processed in the processing container 2 using a plasma. The stage 21 is disposed inside the processing container 2, and includes a placing surface 21a on which the substrate W is placed. The gas supply mechanism 3 supplies a gas into the processing container 2. The exhaust device 4 exhausts the inside of the processing container 2 to reduce the pressure. The microwave introducing module 5 introduces a microwave for generating a plasma into the processing container 2. The control unit 8 controls each part of the plasma processing apparatus 1.

The processing container 2 has, for example, a substantially cylindrical shape. The processing container 2 is made of, for example, a metal material such as aluminum and an alloy thereof. The microwave introducing module 5 is disposed above the processing container 2, and functions as a plasma generating means that introduces an electromagnetic wave (microwave in the embodiment) into the processing container 2 to generate a plasma.

The processing container 2 includes a plate-shaped top wall 11, a bottom wall 13, and a side wall 12 that connects the top wall 11 and the bottom wall 13. The top wall 11 includes a plurality of openings. The side wall 12 includes a carry-in/carry-out port 12a configured to perform the carry-in/carry-out of the substrate W to/from a transfer chamber (not illustrated) adjacent to the processing container 2. A gate valve G is disposed between the processing container 2 and the transfer chamber (not illustrated). The gate valve G has a function of opening/closing the carry-in/carry-out port 12a. The gate valve G hermetically seals the processing container 2 in the closed state, and enables the transfer of the substrate W between the processing container 2 and the transfer chamber (not illustrated) in the opened state.

The bottom wall 13 includes a plurality of (two in FIG. 1) exhaust ports 13a. The plasma processing apparatus 1 includes an exhaust pipe 14 that connects the exhaust port 13a and the exhaust device 4. The exhaust device 4 includes an APC valve and a high-speed vacuum pump capable of reducing the pressure of the internal space of the processing container 2 to a predetermined vacuum degree with a high-speed. The example of the high-speed vacuum pump includes a turbo molecular pump. The pressure of the internal space of the processing container 2 is reduced to a predetermined vacuum degree, for example, 0.133 Pa, by operating the high-speed vacuum pump of the exhaust device 4.

The plasma processing apparatus 1 includes a support member 22 that supports the stage 21 in the processing container 2, and an insulating member 23 provided between the support member 22 and the bottom wall 13. The stage 21 is configured to horizontally place the substrate W. The support member 22 has a cylindrical shape extending from the center of the bottom wall 13 toward the internal space of the processing container 2. The stage 21 and the support member 22 are made of, for example, aluminum having a surface to which an alumite processing (anodizing processing) is performed.

The plasma processing apparatus 1 further includes a radio-frequency bias power source 25 that supplies a radio-frequency power to the stage 21, and a matcher 24 provided between the stage 21 and the radio-frequency bias power source 25. The radio-frequency bias power source 25 supplies a radio-frequency power to the stage 21 to attract ions to the substrate W. The matcher 24 includes a circuit configured to match the output impedance of the radio-frequency bias power source 25 and the impedance of the load side (the stage 21 side).

The plasma processing apparatus 1 may further include a temperature control mechanism (not illustrated) that heats or cools the stage 21. The temperature control mechanism controls, for example, the temperature of the substrate W within a range of 25° C. (room temperature) to 900° C.

The plasma processing apparatus 1 further includes a plurality of gas introducing pipes 16 and a plurality of gas introducing pipes 17. The gas introducing pipes 16 are provided in the top wall 11, and supply a first gas from gas supply holes 16a formed in the lower surface thereof. Similarly, the gas introducing pipes 17 are also provided in the top wall 11, and supply a second gas from gas supply holes 17a formed in the lower surface thereof. Meanwhile, the gas introducing pipes 16 and the gas introducing pipes 17 may protrude from the top wall 11 and/or the side wall 12. The opening of the gas introducing pipe 16 and the gas introducing pipe 17 has a dimple structure that expands from the fine pore of the gas supply hole 16a and the gas supply hole 17a and opens to the processing space. Therefore, by widening the opening of the gas supply hole 16a and the gas supply hole 17a, concentration of electromagnetic wave energy may be reduced, and thus, abnormal discharge is prevented.

A gas supply source 31 is used as a gas supply source of, for example, a plasma generation rare gas, or a gas used for an oxidation processing, a nitriding processing, a film forming processing, an etching processing, or an ashing processing. For example, processing gases of different gas species may be provided from the gas introducing pipe 16 and the gas introducing pipe 17. For example, in the cleaning processing, a fluorine containing gas such as $NF_3$ gas may be supplied from the gas introducing pipe 16, and a rare gas such as Ar gas or He gas may be supplied from the gas introducing pipe 17. The rare gas is added to the fluorine containing gas for plasma stabilization.

The gas supply mechanism 3 includes a gas supply device 3a including the gas supply source 31, a pipe 32a that connects the gas supply source 31 and the plurality of gas introducing pipes 16, and a pipe 32b that connects the gas supply source 31 and the plurality of gas introducing pipes 17. In FIG. 1, although one gas supply source 31 is illustrated, the gas supply device 3a may include a plurality of gas supply sources depending on the type of gas used.

The gas supply device 3a further includes a mass flow controller and an opening/closing valve (not illustrated) provided in the middle of the pipes 32a and 32b. The types of gases supplied into the processing container 2 or the flow rates of the gases are controlled by the mass flow controller and the opening/closing valve.

Each of the components of the plasma processing apparatus 1 is connected to the control unit 8, respectively, and is controlled by the control unit 8. Typically, the control unit 8 may be, for example, a computer. In the example illustrated in FIG. 2, the control unit 8 includes a process controller 81 provided with a CPU, a user interface 82 connected to the process controller 81, and a storage unit 83.

The process controller 81 is a control means configured to collectively control each component involved in, for example, process conditions such as temperature, pressure, a gas flow rate, a bias application radio-frequency power, and a microwave output in the plasma processing apparatus 1. Each of the components may be, for example, the radio-frequency bias power source 25, the gas supply device 3a, the exhaust device 4, and the microwave introducing module 5.

The user interface 82 includes, for example, a keyboard or a touch panel for inputting, for example, commands by a process manager to manage the plasma processing apparatus 1, and a display for visually displaying the operation status of the plasma processing apparatus 1.

The storage unit 83 stores a control program for realizing various processings executed in the plasma processing apparatus 1 by the control of the process controller 81, or recipe in which a processing condition data is recorded. The process controller 81 calls and executes an arbitrary control program or recipe from the storage unit 83 as needed, for example, an instruction from the user interface 82. Therefore, a desired processing is performed in the processing container 2 of the plasma processing apparatus 1 under the control of the process controller 81.

The control program and the recipe described above that are stored in, for example, a computer readable storage medium such as a flash memory, a DVD, a Blue-ray disc may be used. Further, it is possible to transmit the above recipe from another device through, for example, a dedicated line at any time and use it on-line.

Figure 3:
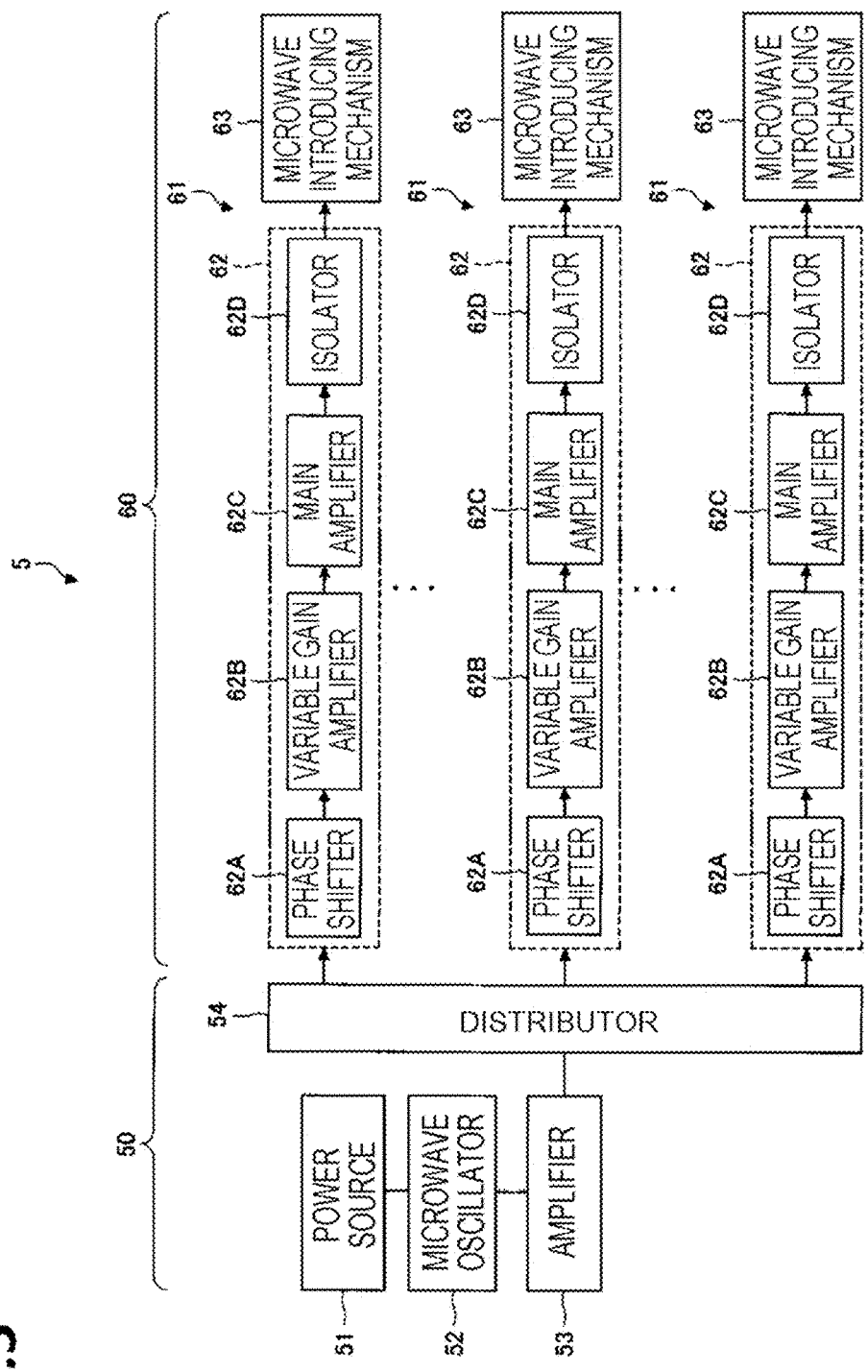
FIG. 3 is an explanation view illustrating a configuration of a microwave introducing module illustrated in FIG. 1.
Figure 4:
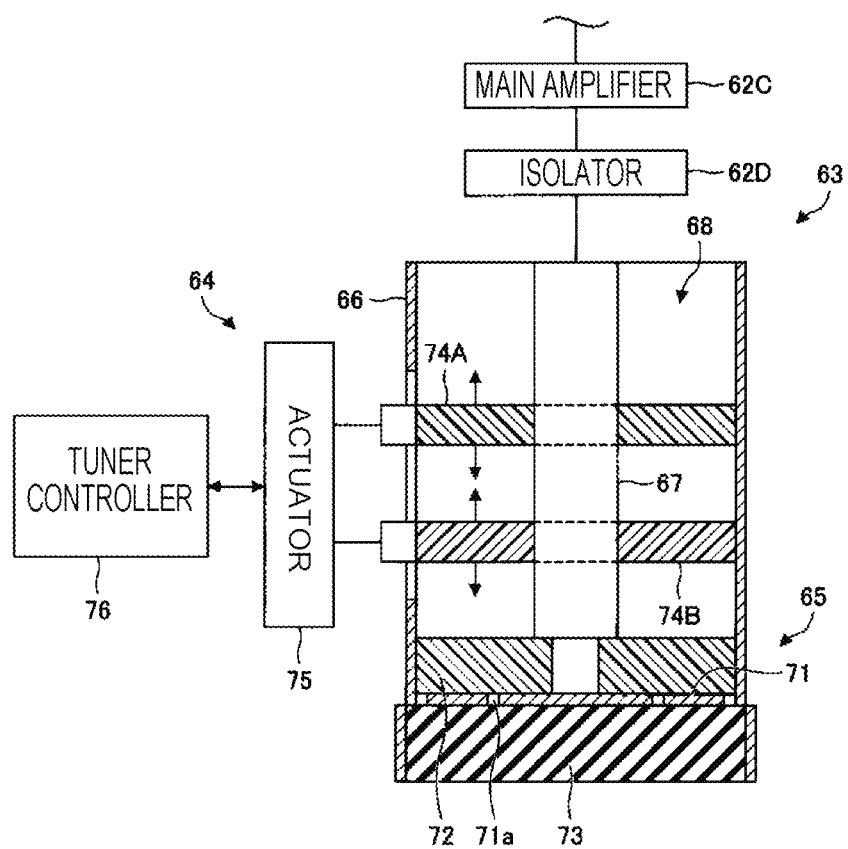
FIG. 4 is a cross-sectional view illustrating a microwave introducing mechanism illustrated in FIG. 3.
Figure 5:
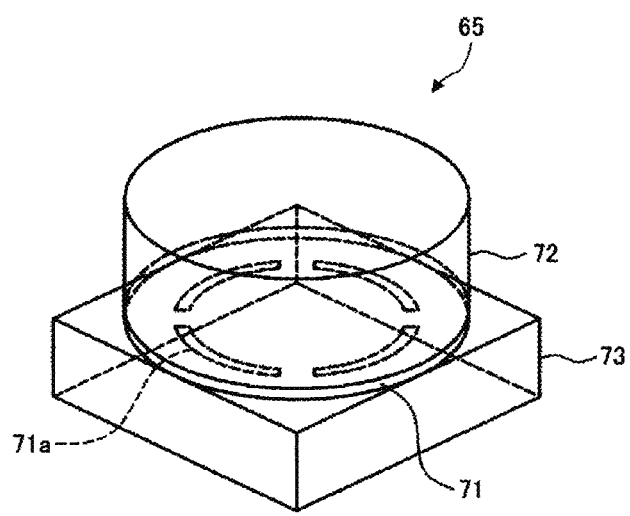
FIG. 5 is a perspective view illustrating an antenna of the microwave introducing mechanism illustrated in FIG. 4.
Figure 6:
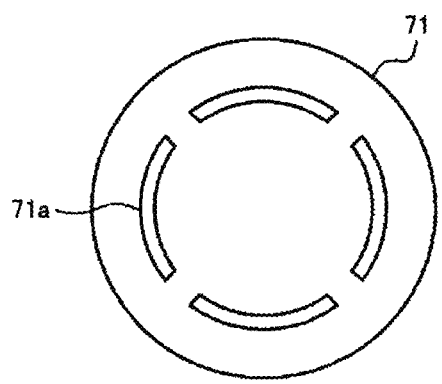
FIG. 6 is a plan view illustrating a planar antenna of the microwave introducing mechanism illustrated in FIG. 4.

Next, a configuration of the microwave introducing module 5 will be described with reference to FIGS. 1 to 6. FIG. 3 is an explanation view illustrating the configuration of the microwave introducing module 5 illustrated in FIG. 1. FIG. 4 is a cross-sectional view illustrating a microwave introducing mechanism 63 illustrated in FIG. 3. FIG. 5 is a perspective view illustrating an antenna of the microwave introducing mechanism 63 illustrated in FIG. 4. FIG. 6 is a plan view illustrating a planar antenna of the microwave introducing mechanism 63 illustrated in FIG. 4.

The microwave introducing module 5 is provided above the processing container 2, and introduces an electromagnetic wave (microwave) into the processing container 2. As illustrated in FIG. 1, the microwave introducing module 5 includes the top wall 11 that is a conductive member, a microwave output unit 50, and an antenna unit 60. The top wall 11 is disposed above the processing container 2 and includes a plurality of openings. The microwave output unit 50 generates a microwave and distributes the microwave to a plurality of paths to output. The antenna unit 60 introduces the microwave output from the microwave output unit 50 to the processing container 2. In the embodiment, the top wall 11 of the processing container 2 also functions as a conductive member of the microwave introducing module 5.

As illustrated in FIG. 3, the microwave output unit 50 includes a power source 51, a microwave oscillator 52, an amplifier 53 that amplifies the microwave oscillated by the microwave oscillator 52, and a distributor 54 that distributes the microwave amplified by the amplifier 53 to a plurality of paths. The microwave generator 52 oscillates a microwave with a predetermined frequency (e.g., 2.45 GHz). The frequency of the microwave is not limited to 2.45 GHz, and may be, for example, 8.35 GHz, 5.8 GHz, or 1.98 GHz. Further, the microwave output unit 50 may be applied to a case where the frequency of the microwave is within a range of 800 MHz to 1 GHz, for example, 860 MHz. The distributor 54 distributes the microwave while matching the impedances of the input side and the output side.

The antenna unit 60 includes a plurality of antenna modules 61. The plurality of antenna modules 61 introduce the microwave distributed by the distributor 54 into the processing container 2, respectively. In the embodiment, the configurations of the plurality of antenna modules 61 are all equal to each other. Each antenna module 61 includes an amplifier unit 62 that mainly amplifies and outputs the distributed microwave, and the microwave introducing mechanism 63 that introduces the microwave output from the amplifier unit 62 into the processing container 2. The antenna module 61 is disposed in the top wall 11 of the processing container 2, and corresponds to the microwave introducing module (electromagnetic wave introducing module) that introduces a microwave into the processing container 2.

The amplifier unit 62 includes a phase shifter 62A, a variable gain amplifier 62B, a main amplifier 62C, and an isolator 62D. The phase shifter 62A changes the phase of the microwave. The variable gain amplifier 62B adjusts a power level of the microwave input to the main amplifier 62C. The main amplifier 62C is configured as a solid state amplifier. The isolator 62D separates the reflected microwave that is reflected by the antenna of the microwave introducing mechanism 63 and is directed to the main amplifier 62C.

The phase shifter 62A changes the phase of the microwave to change the radiation characteristic of the microwave. The phase shifter 62A is used, for example, to control the directivity of the microwave by adjusting the phase of the microwave for each antenna module 61 and to change the distribution of the plasma. The phase shifter 62A may not be provided when the adjustment of the radiation characteristic is not performed.

The variable gain amplifier 62B is used for adjusting variations in the individual antenna module 61 or adjusting plasma intensity. For example, the distribution of the plasma in the entire processing container 2 may be adjusted by changing the variable gain amplifier 62B for each antenna module 61.

The main amplifier 62C includes, for example, an input matching circuit, a semiconductor amplification element, an output matching circuit, and a high-Q resonance circuit, which are not illustrated. As a semiconductor amplification element, for example, GaAsHEMT, GaNHEMT, laterally diffused (LD)-MOS capable of an E-class operation are used.

The isolator 62D includes a circulator and a dummy load (coaxial terminator). The circulator guides the reflected microwave that is reflected by the antenna of the microwave introducing mechanism 63 to the dummy load. The dummy load converts the reflected microwave guided by the circulator into heat. As described above, in the embodiment, the plurality of antenna modules 61 are provided, and a plurality of microwaves introduced into the processing container 2 by the respective microwave introducing mechanisms 63 of the plurality of antenna modules 61 is synthesized in the processing container 2. As a result, the individual isolator 62D may be small, and thus, the isolator 62D may be provided adjacent to the main amplifier 62C.

As illustrated in FIG. 1, the plurality of microwave introducing mechanisms 63 are provided in the top wall 11. As illustrated in FIG. 4, the microwave introducing mechanism 63 includes a tuner 64 configured to match an impedance, and an antenna 65 configured to radiate the amplified microwave into the processing container 2. The microwave introducing mechanism 63 includes a main container 66 made of a metal material and having a cylindrical shape extending in the vertical direction in FIG. 4, and an inner conductor 67 extending in the main container 66 in the same direction as the direction in which the main container 66 extends. The main container 66 and the inner conductor 67 constitute a coaxial pipe. The main container 66 constitutes an outer conductor of the coaxial pipe. The inner conductor 67 has a rod shape or a cylindrical shape. A space between the inner peripheral surface of the main container 66 and the outer peripheral surface of the inner conductor 67 forms a microwave transmission path 68.

The antenna module 61 further includes a power feeding converter (not illustrated) provided on the base end side (upper end side) of the main container 66. The power feeding converter is connected to the main amplifier 62C via a coaxial cable. The isolator 62D is provided in the middle of the coaxial cable. The antenna 65 is provided on the side of the main container 66 opposite to the power feeding converter. As will be described later, a portion of the main container 66 closer to the base end side than the antenna 65 is within the impedance adjustment range by the tuner 64.

As illustrated in FIGS. 4 and 5, the antenna 65 includes a planar antenna 71 connected to the lower end portion of the inner conductor 67, a microwave delaying material 72 disposed on the upper surface side of the planar antenna 71, and a microwave transmitting plate 73 disposed on the lower surface side of the planar antenna 71. The lower surface of the microwave transmitting plate 73 is exposed to the inner space of the processing container 2. The microwave transmitting plate 73 is fitted into the opening of the top wall 11 that is the conductive member of the microwave introducing module 5, through the main container 66. The microwave transmitting plate 73 corresponds to a microwave transmitting window in the embodiment.

The planar antenna 71 has a disc shape. Further, the planar antenna 71 includes a slot 71a formed to penetrate the planar antenna 71. In the example illustrated in FIGS. 5 and 6, four slots 71a are provided, and each slot 71a has an arc shape that is equally divided into four pieces. The number of slots 71a is not limited to four, and may be five or more, or one or more, or three or less.

The microwave delaying material 72 is made of a material having a dielectric constant larger than that of vacuum. As a material for forming the microwave delaying material 72, for example, quartz, ceramics, a fluorine resin such as a polytetrafluoroethylene resin, or a polyimide resin may be used. The wavelength of the microwave lengthens in vacuum. The microwave delaying material 72 has a function of adjusting a plasma by shortening the wavelength of the microwave. Further, the phase of the microwave changes depending on the thickness of the microwave delaying material 72. As a result, it is possible to adjust the planar antenna 71 to an antinode position of the standing wave by adjusting the phase of the microwave depending on the thickness of the microwave delaying material 72. Therefore, it is possible to suppress the reflected wave by the planar antenna 71, and to increase the radiant energy of the microwave radiated from the planar antenna 71. That is, therefore, it is possible to efficiently introduce the power of the microwave into the processing container 2.

The microwave transmitting plate 73 is made of a dielectric material. As a dielectric material for forming the microwave transmitting plate 73, for example, quartz or ceramics may be used. The microwave transmitting plate 73 forms a shape capable of efficiently radiating the microwave in a transverse electric (TE) mode. In the example in FIG. 5, the microwave transmitting plate 73 has a rectangular parallelepiped shape. The shape of the microwave transmitting plate 73 is not limited to the rectangular parallelepiped shape, and may be, for example, a columnar shape, a pentagonal prism shape, a hexagonal prism shape, or an octagonal prism shape.

In the microwave introducing mechanism 63 with such a configuration, the microwave amplified by the main amplifier 62C reaches the planar antenna 71 through the microwave transmission path 68 between the inner peripheral surface of the main container 66 and the outer peripheral surface of the inner conductor 67. Then, the microwave is transmitted from the slot 71a of the planar antenna 71 through the microwave transmitting plate 73 and is radiated to the internal space of the processing container 2.

The tuner 64 constitutes a slug tuner. Specifically, as illustrated in FIG. 4, the tuner 64 includes two slugs 74A and 74B disposed on a portion of the main container 66 closer to the base end side (upper end side) than the antenna 65. The tuner 64 further includes an actuator 75 configured to operate the two slugs 74A and 74B, and a tuner controller 76 configured to control the actuator 75.

The slugs 74A and 74B have a plate shape or an annular shape, and are disposed between the inner peripheral surface of the main container 66 and the outer peripheral surface of the inner conductor 67. Further, the slugs 74A and 74B are made of a dielectric material. As a dielectric material for forming the slugs 74A and 74B, for example, high-purity alumina having a relative dielectric constant of 10 may be used. Since high-purity alumina has a larger relative dielectric constant than quartz (relative dielectric constant of 3.88) or Teflon (registered trademark) (relative dielectric constant of 2.03) that are usually used as materials for forming a slug, the thickness of the slugs 74A and 74B may be reduced. Further, high-purity alumina has a smaller dielectric loss tangent (tan δ) than quartz or Teflon (registered trademark), and has a characteristic that microwave loss may be reduced. High-purity alumina is further characterized by low distortion and heat resistance. As high-purity alumina, an alumina sintered body having a purity of 99.9% or more may be used. Further, as high-purity alumina, single crystal alumina (sapphire) may be used.

The tuner 64 moves the slugs 74A and 74B in the vertical direction by the actuator 75 based on a command from the tuner controller 76. Therefore, the tuner 64 adjusts the impedance. For example, the tuner controller 76 adjusts the position of the slugs 74A and 74B such that the impedance of the terminal end portion is, for example, 50Ω.

In the embodiment, the main amplifier 62C and the tuner 64, and the planar antenna 71 are disposed close to each other. Particularly, the tuner 64 and the planar antenna 71 constitute a lumped constant circuit, and function as a resonator. Impedance mismatch exists in the attaching portion of the planar antenna 71. In the embodiment, the tuner 64 enables highly accurate tuning including a plasma, and thus, the influence of reflection on the planar antenna 71 may be eliminated. Further, the tuner 64 may eliminate the impedance mismatch up to the planar antenna 71 with high accuracy, and thus, substantially the mismatched portion may become a plasma space. Therefore, the tuner 64 enables highly accurate plasma control.

Figure 7:
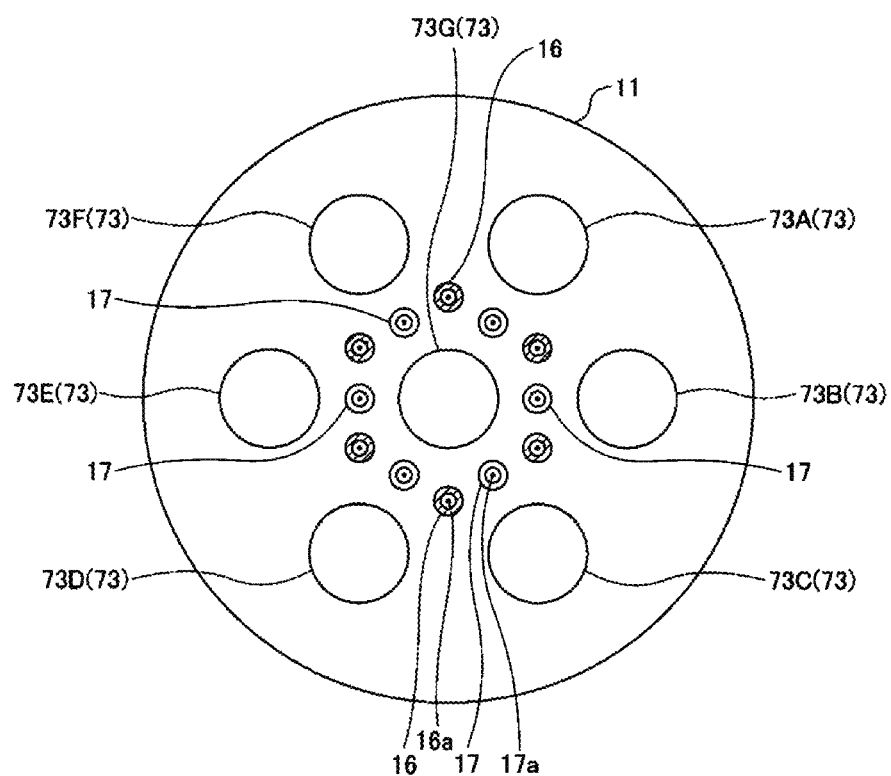
FIG. 7 is a bottom view of a top wall of a processing container illustrated in FIG. 1.

Next, the bottom surface of the top wall 11 of the processing container 2 illustrated in FIG. 1 will be described with reference to FIG. 7. FIG. 7 is a view illustrating an example of a bottom surface of the top wall 11 of the processing container 2 illustrated in FIG. 1. In the following descriptions, it is assumed that the microwave transmitting plate 73 has a columnar shape.

The microwave introducing module 5 includes a plurality of microwave transmitting plates 73. As described above, the microwave transmitting plate 73 corresponds to the microwave transmitting window. The plurality of microwave transmitting plates 73 are disposed on one virtual plane in parallel with the placing surface 21a of the stage 21 in a state of being fitted into the plurality of openings in the top wall 11 that is a conductive member of the microwave introducing module 5. Further, the plurality of microwave transmitting plates 73 include three microwave transmitting plates 73 having the same or substantially the same distance from the center point on the virtual plane. Having substantially the same distance from the center point means that the position of the microwave transmitting plate 73 may be slightly shifted from the desired position from the viewpoint of, for example, the shape accuracy of the microwave transmitting plate 73 or the assembly accuracy of the antenna module 61 (microwave introducing mechanism 63).

In the embodiment, the plurality of microwave transmitting plates 73 include seven microwave transmitting plates 73 disposed to be a hexagonal closest packing arrangement.

Specifically, the plurality of microwave transmitting plates 73 include seven microwave transmitting plates 73A to 73G. Among them, six microwave transmitting plates 73A to 73F are disposed such that the center points thereof coincide with or substantially coincide with the vertices of the regular hexagon, respectively. One microwave transmitting plate 73G is disposed such that the center point thereof coincides with or substantially coincides with the center of the regular hexagon. Substantially coinciding with the vertices or the center point means that the center point of the microwave transmitting plate 73 may be slightly shifted from the above vertices or the center from the view point of, for example, the shape accuracy of the microwave transmitting plate 73 or the assembly accuracy of the antenna module 61 (microwave introducing mechanism 63).

As illustrated in FIG. 7, the microwave transmitting plate 73G is disposed in the central portion of the top wall 11. The six microwave transmitting plates 73A to 73F are disposed outside the central portion of the top wall 11 so as to surround the microwave transmitting plate 73G. Therefore, the microwave transmitting plate 73G corresponds to the central microwave transmitting window, and the microwave transmitting plates 73A to 73F correspond to the outer microwave transmitting windows. In the embodiment, "the central portion of the top wall 11" means "the central portion of the top wall 11 in the planar shape."

In the embodiment, in all the microwave transmitting plates 73, the distances between the center points of arbitrary three microwave transmitting plates 73 adjacent to each other become equal to, or substantially equal to each other. Six gas introducing pipes 16 are disposed equidistantly in the circumferential direction between the outer microwave transmitting plates 73A to 73F and the central microwave transmitting plate 73G. The gas introducing pipes 16 supply the first gas into the processing container 2 from the gas supply holes 16a formed at the tip end thereof. Six gas introducing pipes 17 are disposed between the six gas introducing pipes 16 in the circumferential direction. The gas introducing pipe 17 is disposed between adjacent gas introducing pipes 16. The gas introducing pipes 17 supply the second gas into the processing container 2 from the gas supply holes 17a formed at the tip end thereof.

[Evaluation Result of Cleaning Processing]

Figure 8:
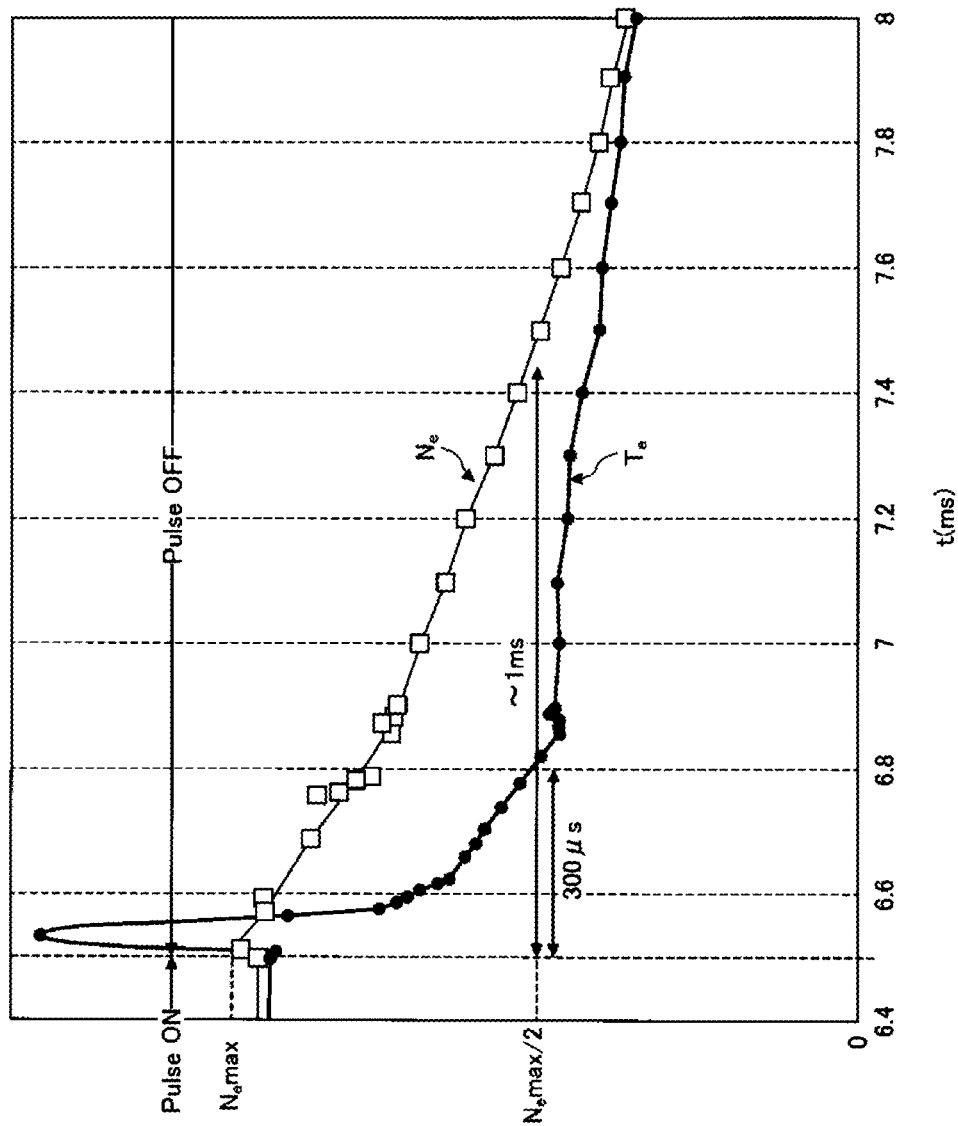
FIG. 8 is a view illustrating an example of evaluation results of $T_e$ and $N_e$ of a pulse plasma in a cleaning processing according to the embodiment.

Next, evaluation results of a cleaning processing performed by the control of the control unit 8 of the plasma processing apparatus 1 will be described with reference to FIG. 8. FIG. 8 is a view illustrating an example of the evaluation results of plasma electron temperature $T_e$ and plasma electron density $N_e$ of a plasma generated in the cleaning processing according to the embodiment. In FIG. 8, the horizontal axis represents time t (ms), and the vertical axis represents the plasma electron temperature $T_e$ and the plasma electron density $N_e$.

In the cleaning processing according to the embodiment, a cleaning gas is supplied into the processing container 2 from the gas introducing pipe 16 and the gas introducing pipe 17. Further, the microwave power from the microwave introducing module 5 is intermittently supplied into the processing container 2. Therefore, the cleaning gas is excited to generate a plasma. The microwave power from the microwave introducing module 5 is controlled to be ON and OFF repeatedly at a duty ratio of, for example, 50%. That is, the "Pulse ON" time in which the microwave power is ON and the "Pulse OFF" time in which the microwave power is OFF in FIG. 8 are periodically repeated at the same time. Further, the pressure of the processing container 2 is set to 20 Pa, and the microwave power is set to 100 W. FIG. 8 illustrates an example of the results of measuring the plasma electron density $N_e$ and the plasma electron temperature $T_e$ that are 90 mm below from the bottom surface of the top wall 11 for the plasma generated under such conditions.

A plasma is generated from the cleaning gas by the microwave power during the "Pulse ON" time. The cleaning of the inside of the processing container 2 is performed by the chemical action of radicals (e.g., F radicals) and the physical action of ions (e.g., Ar ions) in the generated plasma. As an example, $NF_3$ gas is supplied from the gas introducing pipe 16, and Ar gas is supplied from the gas introducing pipe 17 as the cleaning gas. However, a gas containing a fluorine containing gas and a rare gas may be supplied as the cleaning gas. At this time, one of the fluorine containing gas and the rare gas may be supplied from the gas introducing pipe 16, and the other may be supplied from the gas introducing pipe 17.

As illustrated in FIG. 8, when the microwave power is periodically changed from "Pulse ON" (hereinafter, also simply referred to as "ON or ON-state") to "Pulse OFF" (hereinafter, also simply referred to as "OFF or OFF-state"), the plasma electron temperature $T_e$ rapidly increases. Thereafter, the plasma electron temperature $T_e$ is rapidly decreased and is stabled in a low temperature state around 300 μs. When the microwave power is periodically changed from OFF to ON, the plasma electron temperature $T_e$ instantaneously increases, and then, decreases.

Meanwhile, when the microwave power is switched from ON to OFF, the peak as in the plasma electron temperature $T_e$ does not occur in the plasma electron density $N_e$. When the maximum value of the plasma electron density $N_e$ at the time of switching of the microwave power from ON to OFF is $N_e$ max, the time required to reach the plasma electron density ($=N_e$ max/2) that is half the maximum value $N_e$ max is around 1.0 ms.

From the above, when the OFF time of the pulse wave of the microwave is controlled to around 300 μs, it is possible to lower the plasma electron temperature $T_e$ while maintaining the plasma electron density $N_e$. As a result, it is possible to execute the cleaning processing of the inside of the processing container 2 while reducing the damage due to the plasma (particularly, ions). However, the OFF time of the pulse wave of the microwave is not limited to about 300 μs, and may be within a range of 30 μs to 500 μs. Therefore, it is possible to reduce the damage due to ions by lowering the plasma electron temperature $T_e$ while maintaining the plasma electron density $N_e$.

In the related art, in the plasma processing apparatus 1 including a plurality of microwave introducing modules 5, the microwave is continuously supplied from the plurality of microwave introducing modules 5, and a plasma is generated from the cleaning gas by the microwave power to perform the plasma cleaning. Then, electromagnetic wave energy is concentrated in the vicinity of the microwave transmitting plate 73 serving as a microwave radiation port having a relatively high frequency of, for example, 860 MHz, that is, in the vicinity of the microwave transmitting plate 73 on the bottom surface of the top wall 11, and the electron temperature tends to increase. Due to the increase in the electron temperature, the self-bias increases in the vicinity of the microwave transmitting plate 73, the ions are accelerated in a sheath, and the bottom surface of the top wall 11 may be damaged by the impact of the ions in the vicinity of the microwave transmitting plate 73.

Therefore, in the cleaning processing according to the embodiment, the microwave is not continuously radiated, but is radiated as a pulse wave to generate a plasma to perform cleaning. Further, when radiating the pulse wave of the microwave, a plurality of pulse waves of the microwaves are radiated with ON and OFF thereof being synchronized, or a plurality of pulse waves of the microwaves are radiated asynchronously (e.g., randomly), or a combination thereof is used to control, and the cleaning processing is performed. By using the pulse wave of the microwave, it is possible to maintain the plasma electron density $N_e$ while lowering the plasma electron temperature $T_e$.

That is, in the processing method according to the embodiment, a process of supplying a gas into the processing container 2, and a process of intermittently supplying the microwave powers output from the plurality of microwave introducing modules 5 into the processing container 2 are provided. Then, in the process of intermittently supplying the power of the microwaves, the supply of all the microwave powers from the plurality of microwave introducing modules 5 is periodically in an OFF-state for a given time. The "given time" may be, for example, about 300 μs, and may be within a range of 30 μs to 500 μs. According to the processing method, the supply of all the powers of the plurality of microwave introducing modules 5 is periodically in an OFF-state for the "given time." Therefore, as illustrated in FIG. 8, it is possible to lower the plasma electron temperature $T_e$ while maintaining the plasma electron density $N_e$. As described above, in the processing method according to the embodiment, the supply of all the powers of the seven microwave introducing modules 5 is controlled to be OFF for the given time.

Electrons and ions having high energy are accumulated in the sheath. When the microwave power is switched from ON to OFF or from OFF to ON, the state of the plasma is changed. Meanwhile, a plasma has a property of maintaining its own state. As a result, the plasma tries to maintain its own state at the time of the switching, and the electrons having high energy in the sheath move. Due to the movement of electrons and ions that is for suppressing the release of the energy, a phenomenon occurs in which the plasma electron temperature $T_e$ rapidly increases, and then, decreases at the moment when the microwave is ON or OFF.

According to the following equation (1), it may be seen that the plasma electron temperature $T_e$ increases in a state where the ion energy $E_{ion}$ is high. That is, since the ion energy $E_{ion}$ increases due to the movement of electrons and ions that is for suppressing the release of the energy, the plasma electron temperature $T_e$ increases at the moment when the microwave power is ON or OFF.

$$E_{ion} = \frac{T_e}{2} + \frac{T_e}{2} \ln \frac{M}{2\pi m} \qquad \text{Equation (1)}$$

In the equation (1), M is a mass of molecules of the rare gas (e.g., Ar gas) in the gas, and m is the mass of the electron.

With respect to this, in the processing method according to the embodiment, after the microwave power is ON or OFF, the microwave is applied in a pulse shape so as to be ON or OFF again at a timing at which the plasma electron density $N_e$ does not decrease completely. In FIG. 8, as a timing at which the plasma electron density $N_e$ does not decrease completely, a timing at which the plasma electron density $N_e$ is ½ or more of the maximum value plasma electron density $N_e$max is given as an example.

Figure 9:
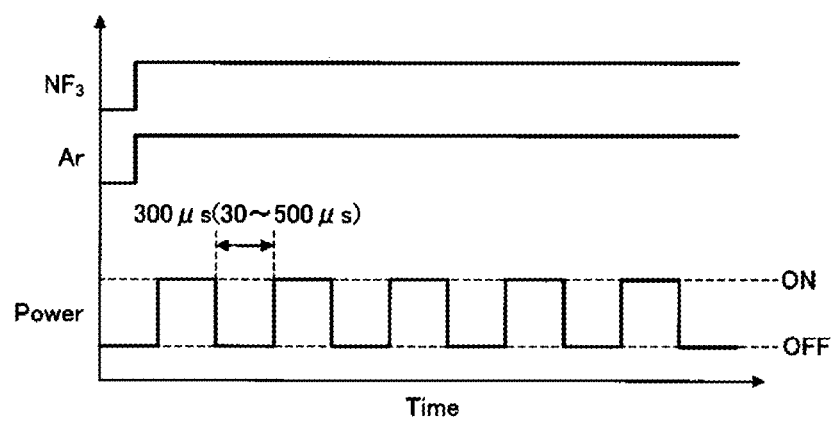
FIG. 9 is a view illustrating an example of ON and OFF of microwave powers output from a plurality of microwave introducing modules according to the embodiment.

For example, as illustrated in FIG. 9, the powers of the microwaves output from seven (a plurality of) microwave introducing modules 5 may be synchronized and intermittently applied. Here, the pulse waves of the microwaves output from the seven microwave introducing modules 5 are ON and OFF at the same or substantially the same timing. As described above, the pulse waves of a plurality of microwaves are synchronously applied, and the power of all the microwaves is in an OFF-state for a given time, and thus, the damage due to the increase in the electron temperature $T_e$ at the time of switching of the microwaves from ON to OFF may be reduced. The given time in which all the microwaves are in an OFF-state is optimally, for example, 300 μs, and may be within a range of 30 μs to 500 μs.

Further, it is possible to obtain an effect of suppressing the increase in the electron temperature $T_e$ at the time of switching of the microwaves from ON to OFF by asynchronously applying the pulse waves of a plurality of microwaves. An example of a method for asynchronously applying the pulse waves of a plurality of microwaves may include a method in which the ON and OFF timings of the microwave powers output from the plurality of microwave introducing modules 5 are randomly set for a time other than the given time. Also in this case, the given time in which all the microwaves are in an OFF-state is optimally, for example, 300 μs, and may be within a range of 30 μs to 500 μs.

As described in the above, in the processing method according to the embodiment, the ON and OFF timings of the microwave powers output from the plurality of microwave introducing modules 5 may be synchronized, or may be asynchronous. When synchronized, the ON and OFF timings of the pulse waves of the microwaves output from the plurality of microwave introducing modules 5 may coincide with each other, or the ON and OFF timings of at least one of the pulse waves of the microwaves may be shifted.

However, when the ON and OFF timings of the pulse waves of the microwaves are coincided, the seven microwave introducing modules 5 are switched ON and OFF at the same timing, and thus, the plasma electron temperature $T_e$ is more likely to increase at the time of switching from ON to OFF or from OFF to ON.

Figure 10:
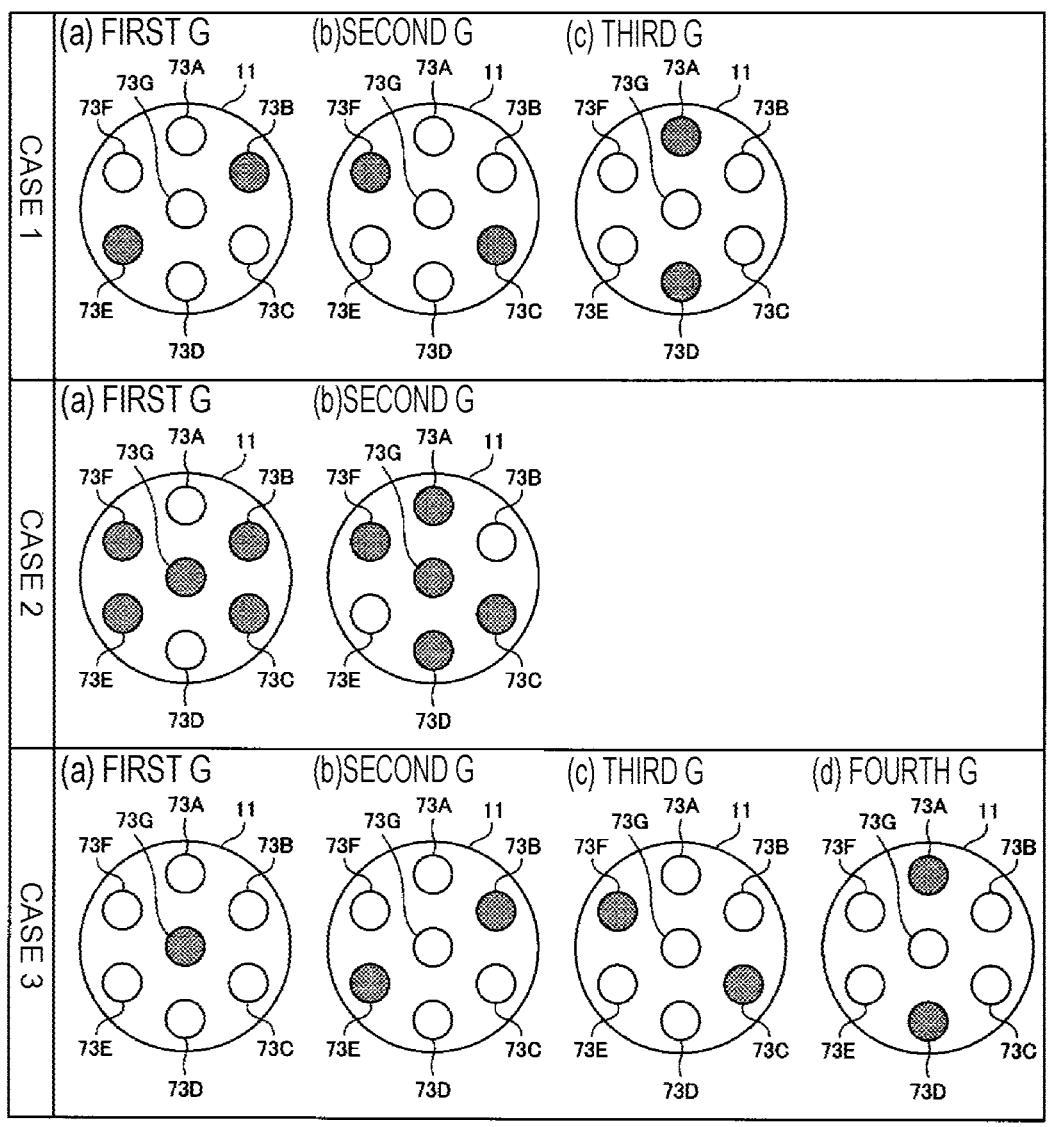
FIG. 10 is a view illustrating an example of a group that synchronizes the microwave powers output from the plurality of microwave introducing modules according to the embodiment.
Figure 11:
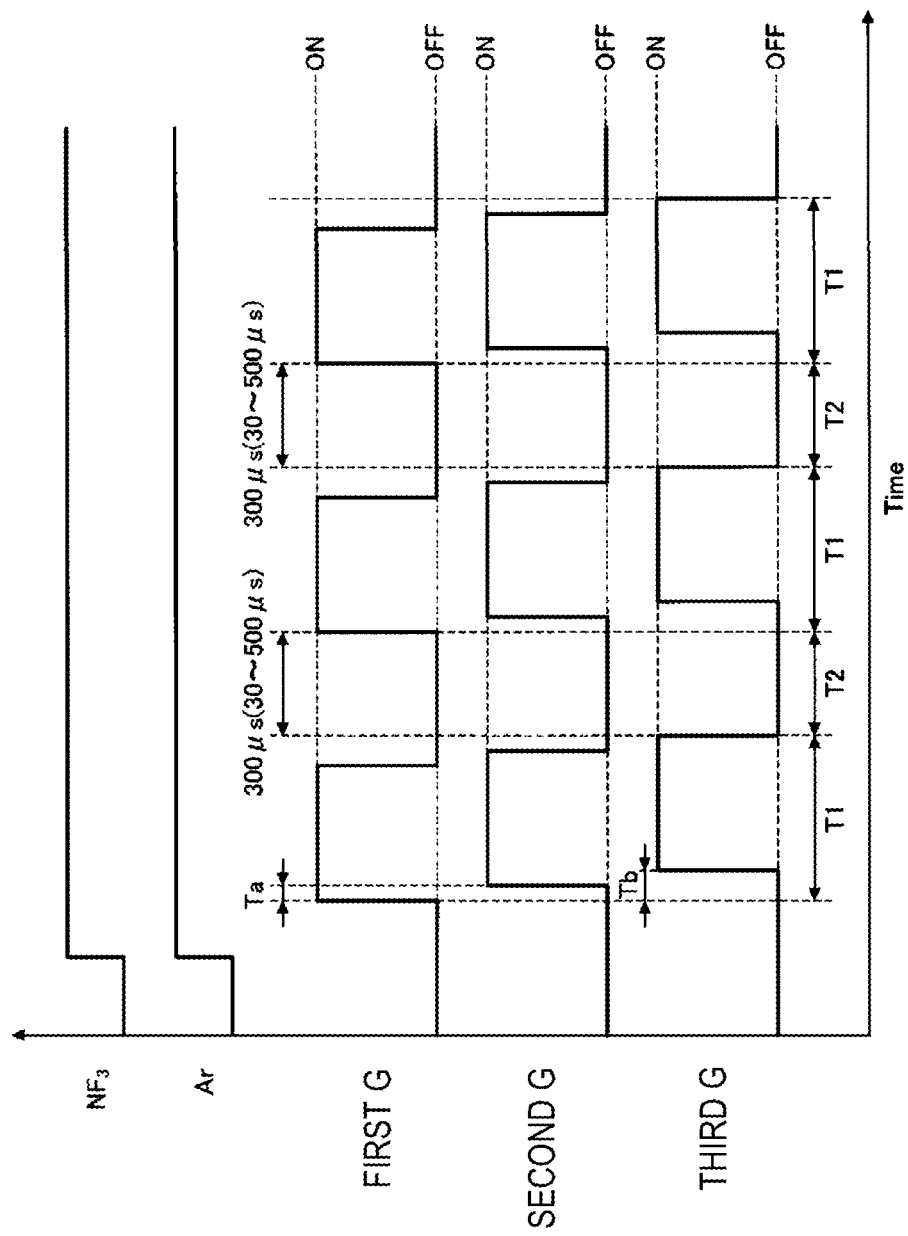
FIG. 11 is a view illustrating an example of ON and OFF of the power from the plurality of microwave introducing modules according to the embodiment.
Figure 12:
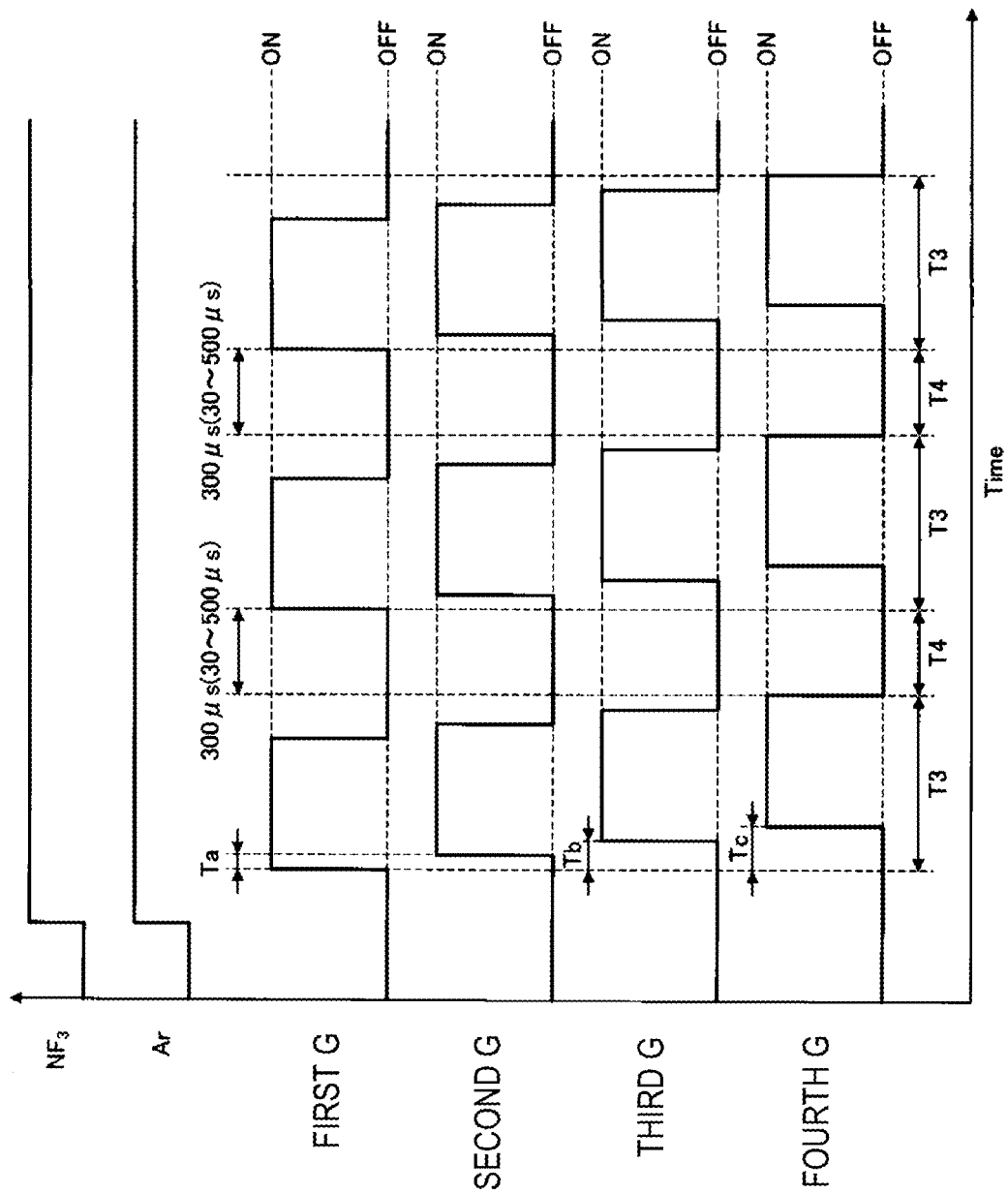
FIG. 12 is a view illustrating other examples of ON and OFF of the power from the plurality of microwave introducing modules according to the embodiment.

Therefore, the ON and OFF timings of at least one of the pulse waves of the microwaves of the seven microwave introducing modules 5 may be shifted. For example, a case where the ON and OFF timings of the microwaves of the seven microwave introducing modules 5 are shifted will be described with reference to FIGS. 10 to 12. FIG. 10 is a view illustrating an example of a group that synchronizes the microwave powers output from the plurality of microwave introducing modules according to the embodiment. FIG. 11 is a view illustrating an example of the ON and OFF of the powers from the plurality of microwave introducing modules according to the embodiment. FIG. 12 is a view illustrating other examples of the ON and OFF of the powers from the plurality of microwave introducing modules according to the embodiment.

For example, as illustrated in FIG. 10, in Case 1, a group of microwaves output from the microwave transmitting plates 73B and 73E is a first group (First G). A group of microwaves output from the microwave transmitting plates 73C and 73F is a second group (Second G). A group of microwaves output from the microwave transmitting plates 73A and 73D is a third group (Third G).

In this case, as illustrated in FIG. 11, all the microwaves output from the microwave transmitting plate 73 are ON after NF₃ gas and Ar gas are supplied. The microwaves of "First G" in FIG. 11 are initially in an ON-state after NF₃ gas and Ar gas are supplied, and the ON-state and the OFF-state are repeated at a duty ratio of 50%. The microwaves of "Second G" in FIG. 11 are in an ON-state after Ta time has passed since the microwaves of First G are in the ON-state, and the ON-state and the OFF-state are repeated at a duty ratio of 50%. The microwaves of "Third G" in FIG. 11 are in an ON-state after Tb (Tb>Ta) time has passed since the microwaves of First G are in the ON-state, and the ON-state and the OFF-state are repeated at a duty ratio of 50%.

With this control, the times of switching of microwaves belonging to the respective groups from ON to OFF or from OFF to ON are shifted from each other, and thus, the increase in the plasma electron temperature $T_e$ is suppressed, and the damage due to the impact of ions may be reduced. In this manner, even in the case where the times of switching of microwaves from ON to OFF or from OFF to ON are shifted from each other, the "given time" in which all the microwaves are in the OFF-state is secured. In the case in FIG. 11, the given time is Time T2 in which all the microwaves are in the OFF-state, with respect to Time T1 in which at least one of the microwaves is in the ON-state. Time T2 may be within in a range of 30 μs to 500 μs, and the optimal value of the example is 300 μs.

In Case 2 in FIG. 10, a group of the microwaves output from the microwave transmitting plates 73B, 73C, 73E, 73F, and 73G is a first group. Further, a group of the microwaves output from the microwave transmitting plates 73A, 73C, 73D, 73F, and 73G is a second group. Also in this case, each group may be controlled at the timing illustrated in FIG. 11 (however, Third G does not exist).

In Case 3 in FIG. 10, a group of microwaves output from the microwave transmitting plate 73G may be a first group, and a group of microwaves output from the microwave transmitting plates 73B and 73E may be a second group. Further, a group of microwaves output from the microwave transmitting plates 73C and 73F may be a third group, and a group of microwaves output from the microwave transmitting plates 73A and 73D may be a fourth group.

In this case, the microwaves of "First G" in FIG. 12 are initially in an ON-state after NF₃ gas and Ar gas are supplied, and the ON-state and the OFF-state are repeated at a duty ratio of 50%. The microwaves of "Second G" in FIG. 12 are in an ON-state after Ta time has passed since the microwaves of First G are in the ON-state, and the ON-state and the OFF-state are repeated at a duty ratio of 50%. The microwaves of "Third G" in FIG. 12 are in an ON-state after Tb (Tb>Ta) time has passed since the microwaves of First G are in the ON-state, and the ON-state and the OFF-state are repeated at a duty ratio of 50%. The microwaves of "Fourth G" in FIG. 12 are in an ON-state after Tc (Tc>Tb>Ta) time has passed since the microwaves of First G are in the ON-state, and the ON-state and the OFF-state are repeated at a duty ratio of 50%.

With this control, the times of switching of microwaves from ON to OFF or from OFF to ON are shifted from each other, and thus, the increase in the plasma electron temperature $T_e$ is suppressed, and the damage in the processing container 2 due to the impact of ions is reduced. In this manner, even in the case where the times of switching of microwaves from ON to OFF or from OFF to ON are shifted from each other, the "given time" in which all the microwaves are in the OFF-state is secured. In the case in FIG. 12, the given time is Time T4 in which all the microwaves are in the OFF-state, with respect to Time T3 in which at least one of the microwaves is in the ON-state. Time T4 may be within in a range of 30 μs to 500 μs, and the optimal value of the example is 300 μs.

In the time other than the given time, the ON and OFF timings of the pulse waves of the microwaves output from the plurality of microwave introducing modules may be randomly set. Also in this case, the "given time" in which all the microwaves are in the OFF-state is secured within in a range of 30 μs to 500 μs. In the above examples, the duty ratio of the pulse wave of the microwave is set to 50%, but the duty ratio is not limited thereto, and may be 10% to 50%. Further, in the above examples, the first ON after a given time is fixed to First G, but after the given time, the group to be first ON may be changed every time to be ON, such as First G→Second G→Third G→First G→Second G→Third G. Therefore, it is possible to disperse the part where the plasma electron temperature $T_e$ increases, and to relatively reduce the damage on each part.

[Processing Method]

Figure 13:
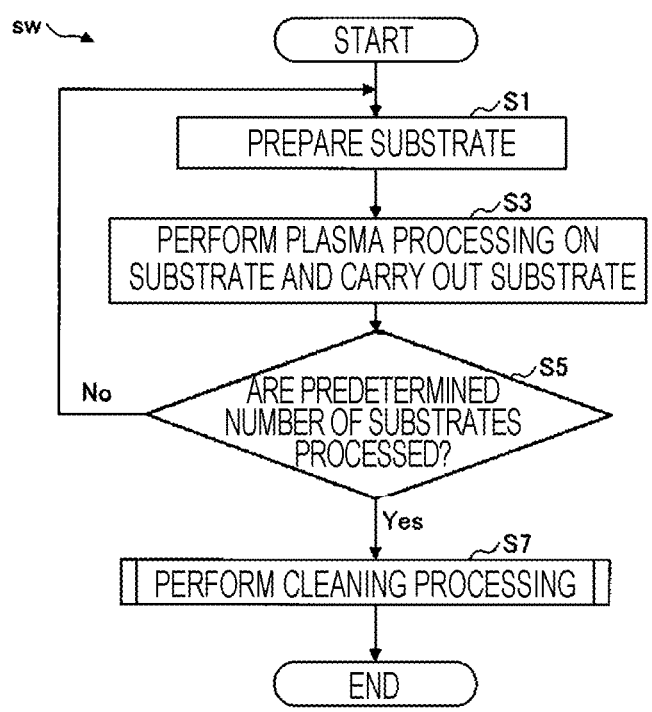
FIG. 13 is a flowchart illustrating an example of a processing method according to the embodiment.
Figure 14:
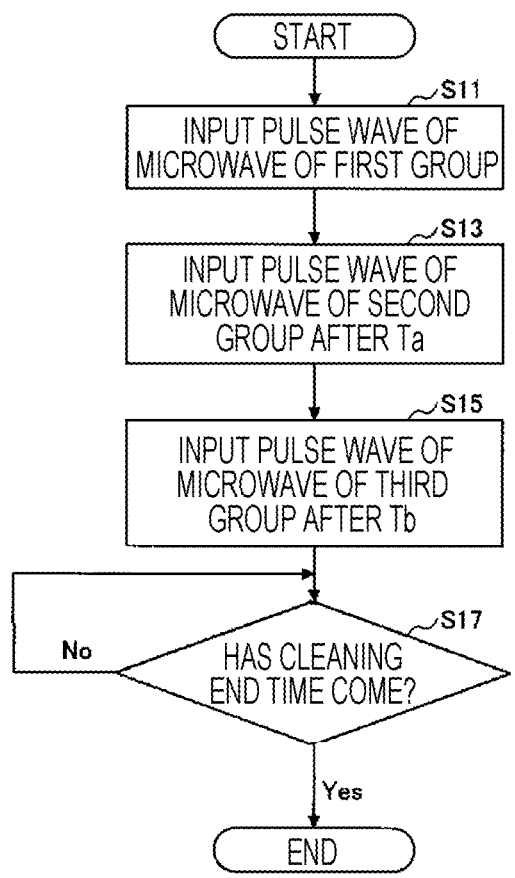
FIG. 14 is a flowchart illustrating an example of a cleaning processing method using the plurality of microwave introducing modules according to the embodiment.

Next, an example of a processing method according to the embodiment will be described with reference to FIGS. 13 and 14. FIG. 13 is a flowchart illustrating an example of a processing method sw according to the embodiment. FIG. 14 is a flowchart illustrating an example of a cleaning processing method using the plurality of microwave introducing modules 5 according to the embodiment. The cleaning processing method illustrated in FIG. 14 is called in Step S7 in FIG. 13. The processing method in FIG. 13 and the cleaning processing method in FIG. 14 are controlled by the control unit 8.

When the processing method sw in FIG. 13 is started, the control unit 8 carries the substrate W into the processing container 2, and holds the substrate W on the stage 21 to prepare the substrate W (Step S1). Next, the control unit 8 supplies a gas for processing the substrate W, generates a plasma from the gas by introducing the microwave power, and executes predetermined processings such as a film forming processing, a diffusion processing, an etching processing, and an ashing on the substrate W by the generated plasma. Thereafter, the control unit 8 carries out the processed substrate W (Step S3).

Next, the control unit 8 determines whether a predetermined number of substrates are processed (Step S5). When it is determined that a predetermined number of substrates are not processed, the control unit 8 returns to Step S1, prepares the next unprocessed substrate W, and performs the plasma processing on the next substrate W (Steps S1 and S3). In Step S5, when it is determined that a predetermined number of substrates are processed, the control unit 8 proceeds to Step S7 to execute the cleaning processing, and the processing ends. When the processing ends, the output of the microwaves is stopped, and the supply of the gas is stopped.

Details of the cleaning processing executed in Step S7 will be described with reference to FIG. 14. The control unit 8 inputs the pulse waves of the microwaves of a predetermined first group among the seven microwave introducing modules 5 (Step S11). For example, the microwaves of First G in FIG. 11 are in the ON-state, and periodically repeat the ON-state and the OFF-state.

Next, the control unit 8 inputs the pulse waves of the microwaves of a predetermined second group among the seven microwave introducing modules 5 (Step S13). For example, the microwaves of Second Gin FIG. 11 are in the ON-state after Ta time in FIG. 11, and periodically repeat the ON-state and the OFF-state.

Next, the control unit 8 inputs the pulse waves of the microwaves of a predetermined third group among the seven microwave introducing modules 5 (Step S15). For example, the microwaves of Third G in FIG. 11 are in the ON-state after Tb time in FIG. 11, and periodically repeat the ON-state and the OFF-state. Next, the control unit 8 determines whether the cleaning end time has come (Step S17). When it is determined that the cleaning end time has come, the control unit 8 ends the processing.

According to the plasma processing method, the supply of all the powers of the plurality of microwave introducing modules 5 is periodically in the OFF-state for the "given time." Therefore, it is possible to reduce the damage due to ions by further efficiently lowering the plasma electron temperature $T_e$ while maintaining the plasma electron density $N_e$.

For example, the processing method according the embodiment is not limited to the cleaning processing, but may be used in processing methods such as a film forming processing and an etching processing.

According to an aspect, it is possible to lower a plasma electron temperature while maintaining a plasma electron density.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:
   supplying a gas into a processing container; and
   intermittently supplying, into the processing container, microwave powers output from a plurality of microwave introducing modules comprising a first microwave introducing module and a second microwave introducing module,
   wherein, in the intermittently supplying the microwave powers, an ON timing of a microwave power output from the first microwave introducing module is different from an ON timing of a microwave power output from the second microwave introducing module and a cycle of the microwave power output from the first microwave introducing module is substantially the same as a cycle of the microwave power output from the second microwave introducing module, while cycles of the microwave powers output from each of the plurality of microwave introducing modules are maintained constantly, and
   the supply of all the microwave powers from the plurality of microwave introducing modules is periodically in an ON state for a first given time and in an OFF state for a second given time.

2. The plasma processing method according to claim 1, wherein the plasma processing method is used for a cleaning processing, and the gas is a cleaning gas.

3. The plasma processing method according to claim 2, wherein the cleaning gas contains a fluorine-containing gas and a rare gas.

4. The plasma processing method according to claim 1, wherein the second given time is within a range of 30 μs to 500 μs.

5. A plasma processing apparatus comprising:
   a processing container configured to process a substrate; and
   a controller,
   wherein the controller is programmed to control a processing including:
      supplying a gas into the processing container; and
      intermittently supplying, into the processing container, microwave powers output from a plurality of microwave introducing modules comprising a first microwave introducing module and a second microwave introducing module,
   wherein, in the intermittently supplying the microwave powers, an ON timing of a microwave power output from the first microwave introducing module is different from an ON timing of a microwave power output from the second microwave introducing module and a cycle of the microwave power output from the first microwave introducing module is substantially the same as a cycle of the microwave power output from the second microwave introducing module, while cycles of the microwave powers output from each of the plurality of microwave introducing modules are maintained constantly, and the supply of all the microwave powers from the plurality of microwave introducing modules is controlled to be periodically in an ON state for a first given time and in an OFF state for a second given time.

* * * * *